(12) United States Patent
Butterfield et al.

(10) Patent No.: US 7,511,855 B2
(45) Date of Patent: Mar. 31, 2009

(54) SYSTEMS AND METHODS FOR REDUCING EDGE EFFECTS

(75) Inventors: Paul M. Butterfield, Ontario, NY (US); Michael J. Diehl, Rochester, NY (US)

(73) Assignee: Xerox Corporation, Norwalk, CT (US)

( * ) Notice: Subject to any disclaimer, the term of this patent is extended or adjusted under 35 U.S.C. 154(b) by 647 days.

(21) Appl. No.: 11/297,294

(22) Filed: Dec. 9, 2005

(65) Prior Publication Data

US 2007/0134561 A1    Jun. 14, 2007

(51) Int. Cl.
*G06F 15/00* (2006.01)
*G06K 1/03* (2006.01)
(52) U.S. Cl. .................. 358/1.9; 358/3.27; 382/266
(58) Field of Classification Search .................. 358/1.1, 358/1.3, 1.4, 1.9, 3.01, 3.06, 3.27, 3.29, 3.3, 358/501, 401, 296; 382/266
See application file for complete search history.

(56) References Cited

U.S. PATENT DOCUMENTS

| 7,265,871 B2* | 9/2007 | Ishii et al. ..................... 358/1.9 |
| 2004/0183796 A1* | 9/2004 | Velde et al. ................. 345/419 |

* cited by examiner

*Primary Examiner*—Thomas D Lee
(74) *Attorney, Agent, or Firm*—Oliff & Berridge, PLC

(57) ABSTRACT

Systems, methods, and programs for reducing edge effects, the systems, methods, and programs include inputting an image mask, the image mask defining the location of a boundary to receive a coating, modifying an edge of the image mask to reduced the thickness of the coating at the modified edge; creating a printing plate base on the modified image mask; and using the printing plate to print the coating on a substrate.

15 Claims, 4 Drawing Sheets

FIG. 2A
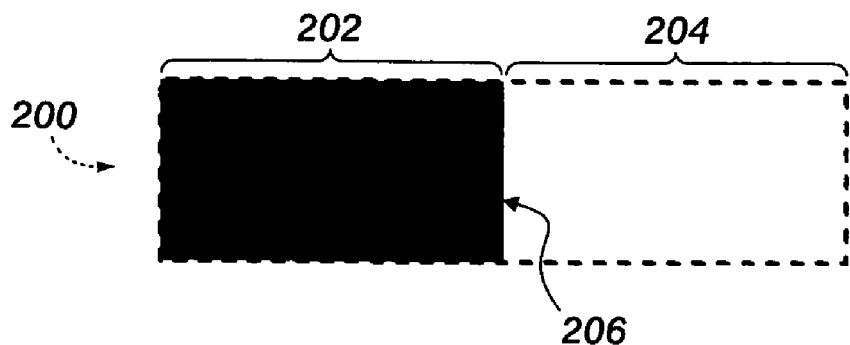
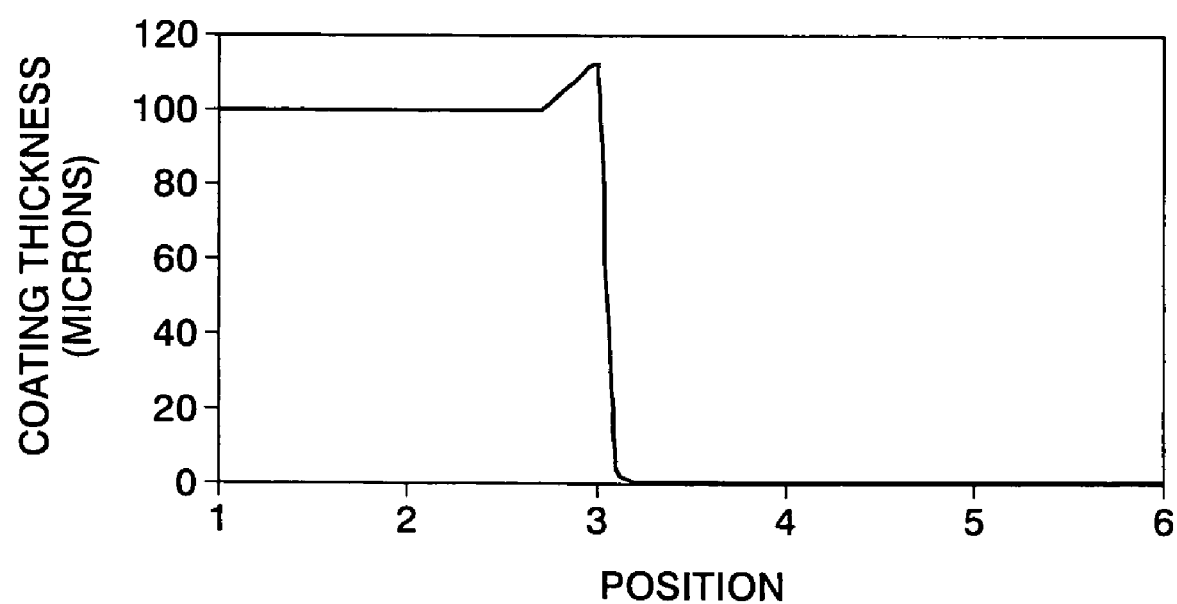
FIG. 2B

SYSTEMS AND METHODS FOR REDUCING EDGE EFFECTS

BACKGROUND

Related technical fields includes spot coating systems and methods.

Graphic professionals generally use spot varnishes or coatings to emphasize graphical elements in high-end collaterals. For example, a catalog might include pictures of a product on the page with a spot varnished and/or coating applied only on the product pictures. This imparts a higher gloss just to the pictures that gives them added visual impact on the viewer.

Further, by using a coating, for example, bindery (off-press) coatings, such as ultraviolet coating (UV coating) over an image and/or printed piece, the UV coating can be used, for example, as a spot covering to accent a particular image on the sheet or as an overall coating (flood coating). The UV coating may protect the printed piece by providing, for example, an additional covering which protects the ink from scuffing. In addition, the UV coating may, for example, draw the reader's eyes to particular items and to add depth and interest to the printed piece or image.

In traditional lithographic offset printing, spot coatings are often applied in a separate unit on the press. For example, cyan, magenta, yellow and black might be printed with the first four units of the press. A spot coating, for example, might be applied with the fifth unit, with a printing plate, for example, which allows the coating to be applied in the same manner as one of the color inks.

SUMMARY

Coating systems, such as coating systems based on flexographic printing technology, have been adapted for direct digital printing systems. This integration provides unique and new opportunities for providing spot coating, such as varnish and/or UV coatings, together with all the other benefits of digital printing. For example, flexographic coating systems use a conformable, elastomeric relief plate technology to transfer the coated image.

Also, spot coatings, for example, spot varnish and/or UV coating, are used as part of a graphic arts treatment that can impart a desirable image-wise gloss treatment to a particular part of a page or the entire page. For example, a flexographic coating system may utilize an in-line spot UV coater as part of its system to apply, for example, a spot coating such as a UV coating as part of the graphical arts treatment.

Typically, boundary regions between conventionally coated and uncoated areas are crisp, sharp edges. This transition is the most sensitive to the undesirable characteristics of spatial variability and a ridge-like effect of higher coating thickness at the border. This effect is more pronounced at edge vertices. The edges may occur, for example, from applying a clear coating, for example, a spot coating, such as a varnish and/or an Ultraviolet coating (UV coating). The boundaries between the coated and uncoated areas may cause discontinuity between the coated and uncoated boundaries at or around the edge appearances, which may diminish the visual impact of the spot coating of the image or printed surface. As a result, the value provided by the spot coating may be reduced or destroyed.

Various implementations of the principles described herein include a method for reducing edge effects, the method including inputting an image mask, the image mask defining the location of a boundary to receive a coating; modifying an edge of the image mask to reduce the thickness of the coating at the modified edge; creating a printing plate based on the modified image mask; and utilizing the printing plate to print the coating on a substrate.

Various implementations of the principles described herein include a system for reducing edge effects. The system includes a controller that inputs an image mask. The image mask defines the location of a boundary to receive a coating. The controller modifies an edge of the image mask to reduce the thickness of the coating at the modified edge; creates a printing plate base on the modified image mask; and uses the printing plate to print the coating on a substrate.

Various implementations of the principles described herein include a storage medium for storing a set of program instructions executable on a data processing device and usable for reducing edge effects, the instructions including instructions for inputting an image mask, the image mask defining the location of a boundary to receive a coating; instructions for modifying an edge of the image mask to reduce the thickness of the coating at the modified edge; instructions for creating a printing plate base on the modified image mask; and instructions for using the printing plate to print the coating on a substrate.

BRIEF DESCRIPTION OF THE DRAWINGS

Exemplary implementations will now be described with references to the accompanying drawings, wherein:

FIGS. 2A-2B show a plan view and spatial profile of an unmodified spot coating;

IMPLEMENTATIONS

Figure 1:
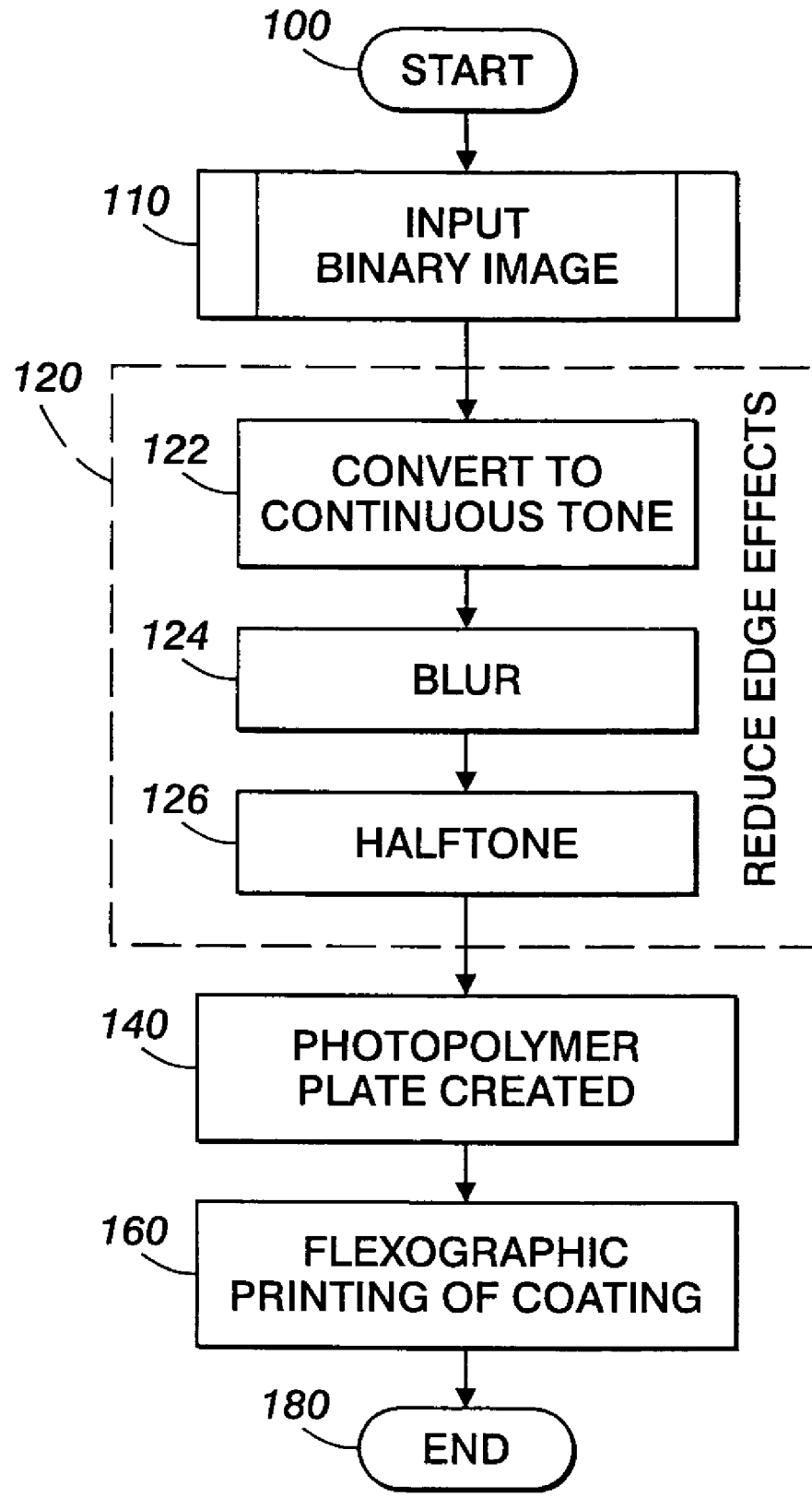
FIG. 1 is a flowchart illustrating an exemplary method for minimizing the perception of spot coating edge effects.

FIG. 1 shows an exemplary method for minimizing the perception of clear coating systems, such as spot coating systems. The method may be used, for example, with binary (off-press) coatings, for example, binary coatings that utilize spot varnishes and/or UV coatings as part of the graphic arts treatment for imparting a desirable image wise gloss treatment to an image or printed piece or a portion of the image or printed piece. The exemplary method may also be used with, for example, printing press, such as a digital printing press that utilizes a flexographic printing process. However, it should be appreciated that the method may be used with any system or device capable of producing a spot coating. Accordingly, the exemplary method need not be limited by any exemplary structure described below.

According to this example, the term spot coating is intended to encompass all clear coating systems and processes including UV coatings, and/or varnish coatings, and/or any other coating process type that may result.

The exemplary method begins in step 100 and continues to step 110. In step 110, a binary image mask is created. For example, a graphic design is created that defines the boundaries of areas to receive spot coatings. The binary image mask may be a binary pattern that determines portions of a substrate, for example, paper, that will be overprinted with a clear coating and that portion which will remain untreated, for example, the uncoated boundary, which does not receive the spot coating process. The binary image mask may be created by, for example, using software application. Operation continues to step 120.

In step 120, one or more boundaries of the coated and uncoated regions may be transformed from binary edges to gradient sweeps. For example, gradient sweeps may be added to the coating boundaries to reduce the edge vertices, for example, the sharp edges that occur between the coated and uncoated boundaries during the spot coating process. Alternatively, a continuous slope may be added to the coating boundaries to reduce the edge vertices.

During step 120, the binary image may be converted to be a continuous tone 122, blurred 124, and/or halftoned 126, to create a gradient sweep at the boundaries between the coated and uncoated areas. The gradient sweep could be applied during a halftone screen process so that there is, for example, a gradual tapering, feathering, reducing, sloping, or tailing-off of the amount of material that is applied or laid down through the process of half-toning. The half-toning process may be applied to the clear coating as part of the process of applying spot coatings. After the gradient sweep is added to the coating boundaries, operation continues to step 140.

In step 140, the converted binary image mask may be used to create a printing plate, for example, a photopolymer plate, may result such as a flexographic plate. The creation of the photopolymer plate, for example, results in a flexible plate which holds spot coatings in the desired or designated areas, while repelling the spot coatings in other areas, for example, repelling the spot coatings in the undesired or undesignated areas.

The printing plate may be made, for example, by laser engraving, such as direct digital plate making. In direct digital plate making, an image is scanned or computer generated. Then a computer guided laser etches the image onto the printing plate. During this process, for example, the coated/uncoated boundaries that are transformed from binary edges to gradient sweeps during the process 120, may be employed during the direct digital plate making process to reduce and/or gradually sweep the boundaries areas between the coated/uncoated areas. After the printing plate is created, operation continues to step 160.

In step 160, the coating is printed. For example, flexographic printing of the spot coating may be performed. The printing plate, for example, the flexographic plate, may be used via one or more conventional processes to print the coatings on a substrate, for example, paper. For exampled, after printing an image to be spot coated, the substrate may run through a number of operations to be finished, the substrate may be run through a spot coating process to apply a spot coating to the desired or designated areas of the substrate. After applying the spot coating, operation continues to step 180, where the exemplary method ends.

Figure 3A:
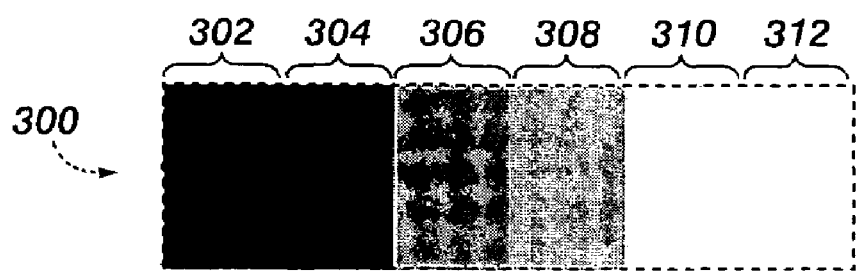
FIGS. 3A-3B show a plan view and spatial profile of an exemplary modified spot coating.
Figure 3B:
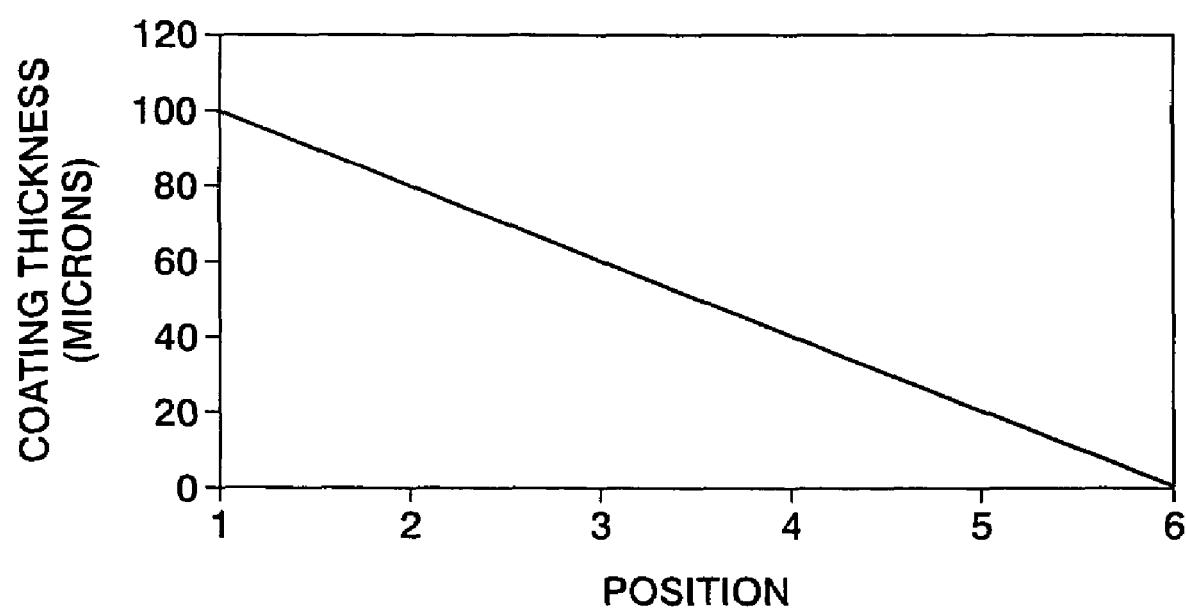

A comparison between unmodified spot coatings verses modified spot coatings are shown in FIGS. 2A-2B and FIGS, 3A-3B, respectively. FIGS. 2A-2B show unmodified spot coatings profiles without implementing the techniques of the exemplary method of FIG. 1. FIGS. 3A-3B show examples of coating profiles using the techniques of the exemplary method of FIG. 1 for applying the gradient sweep to minimize perception of spot coating edge effects.

FIG. 2A shows a plan view of a substrate 200, for example, paper, that includes unmodified coated area 202 and uncoated area 204. As shown in FIG. 2A, the aerial image profile 200 shows an abrupt boundary between the coated area 202 and the uncoated area 204. The coated area 202 includes a coating thickness that is thicker than the uncoated area 204, which is uncoated. Accordingly, the uncoated area 204 of the substrate is not as thick as the coated area 202.

As illustrated in FIGS. 2A and 2B, the coating thickness versus the position of the coated boundary and uncoated boundary forms, for example, a sharp edge 206. At the edge 206 there is discontinuity between the coating boundary, i.e., unmodified coated area 202, and the uncoated boundary, i.e., uncoated area 204, which forms a ridge, for example. The edge 206 is formed, for example, where the transition between the coated and uncoated areas 202, 204 occurs. Because the coated area 202 is thicker than the uncoated area 204, a ridge forms along the edge 206 vertices.

As shown in FIG. 2B, the edge 206 of the coated area may diminish the value that is added by the spot coating due to the discontinuity that is created from the build-up of material, that is, the extra coating at that boundary.

FIGS. 3A and 3B show exemplary modified spot coating profiles. As shown in FIGS. 3A and 3B, the modified spot coating reduces the sharp, edge, and/or thickness that occurs in the boundary area between the coated and uncoated areas. By applying, for example, gradient sweep, the edge appearance may be feathered-out, that is, the thickness between the uncoated and coated areas gradually slopes from a thickness of the coating to substantially zero over the length of the garment (e.g., positions 1 to 6). Thus, the harshness of the edge boundary may be reduced and the transitional boundary between the coated area and the uncoated area may not distract from the visual intent of an image and/or text being accented by the spot coating.

As shown in FIGS. 3A and 3B, the gradient sweep added to the coating boundaries reduces the sharp edge between the coated and uncoated areas. For example, during the printing process, in which a halftone screen is applied, the thickness between the coating and uncoated boundaries is gradually reduced. The half-toning process may be used, for example, over a millimeter or two to gradually reduce, feather, or tail-off the amounts of material that is laid down through the process of half-toning during the spot coating process In FIGS. 3A and 3B, an exemplary six-step gradient sweep is illustrated. For example, FIG. 3A shows the material thickness of the coating at the edge vertices being reduced over a six-step process 300, i.e., from steps 302-312. FIGS. 3A and 3B show a six-step process for simplicity, but any number of levels may be utilized or a continuous slope may be applied. For example, during a flexographic process in which a digital printing process is utilized, the spot coating may be applied over several different millimeters. That is, for example, starting at one millimeter and gradually reducing the amounts of material being applied during the clear coating process. Thus, any number steps of any distance and/or over any distance can be applied during the half-toning process to reduce the thickness versus the position of the edge of the spot coatings.

As shown in FIG. 3B, the coated and uncoated boundaries are transformed from binary edges to gradient sweeps, which gradually reduce the thickness of the UV coating material being applied so that the edge thickness is gradually reduced over positions 1 to 6. Although, according to the example the coating is reduced in a step-wise fashion, a continuum line is drawn from coating thickness 100 to position 6 for simplicity.

The exemplary method as described provides a method for minimizing the harshness of the edge transition by replacing the sharp transition with a gradual gradient sweep. The transition between the uncoated and coated areas are smoothed out to reduce the harshness between the uncoated and coated areas utilizing the exemplary methods, which extended the transition from, for example, about 100% to about 0% coating over a short distance on a, for example, a raised image (relief), flexographic transfer plate. Thus, the exemplary method provides a gradual gradient sweep and/or continuous slop between coated and uncoated boundaries and does not, for example, distract the readers eye from the particular items being emphasized by the spot coating, such as clear coatings, UV coatings or vanish coatings, that is, the portions of the image or printed piece that is being accent by the spot coating for visual enhancement.

Figure 4:
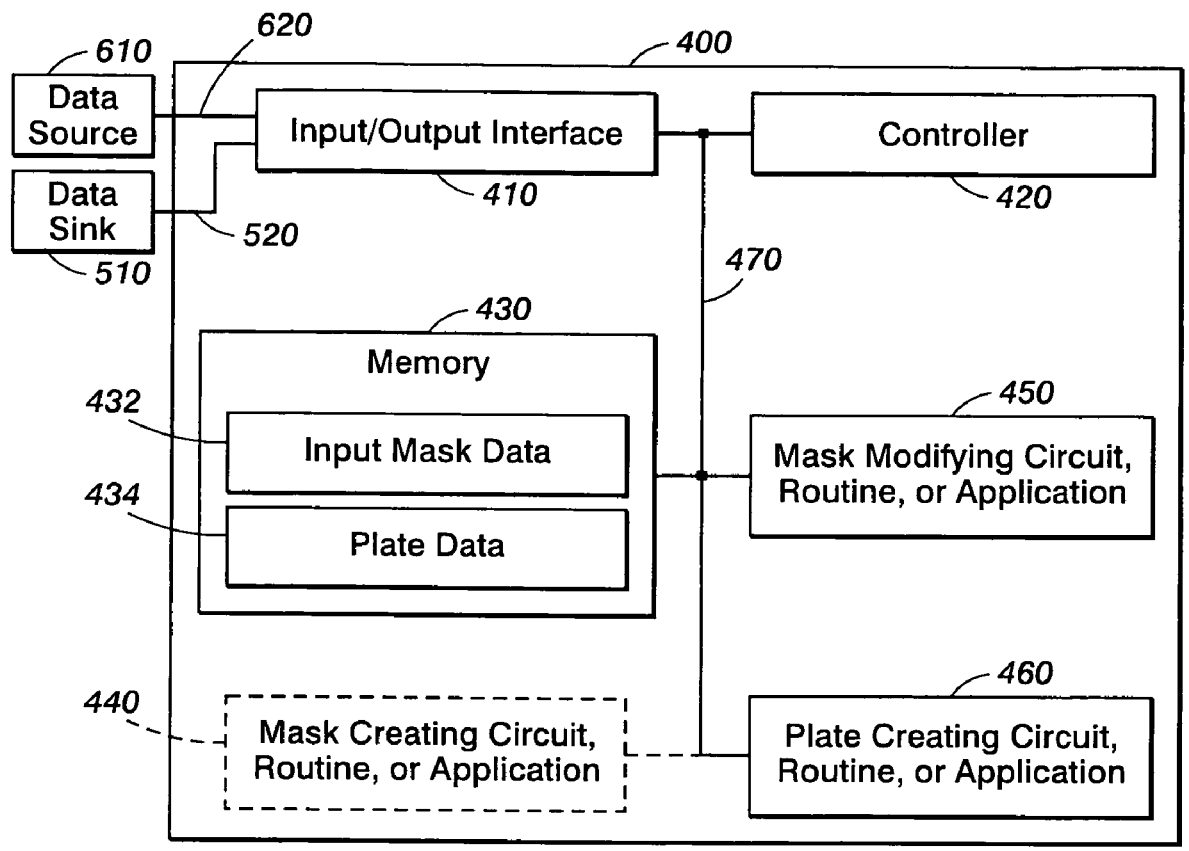
FIG. 4 shows a functional block diagram of an exemplary system for producing less perceptible of spot coating edge effects.

FIG. 4 shows a functional block diagram of an exemplary system 400 for minimizing perception of spot coating edge effects. The system 400 may be used, for example, to implement one or more of the above-described exemplary methods. As shown in FIG. 4, the system 400 may be physically, functionally, and/or conceptually divided into an input/output interface 410, a controller 420, a memory 430, a mask modifying circuit, routine, or application 450, and/or a plate creating circuit, routine, or application 460, each appropriately interconnected by one or more data/control busses and/or application programming interfaces 470, or the like.

The input/output interface 410 may be connected to one or more data sources 610 over one or more links 620. The data source(s) 610 can be a locally or remotely located device that stores and/or transmits electronic data, such as a client or a server of a wired or wireless network, such as, for example, an intranet, an extranet, a local area network, a wide area network, a storage area network, the Internet (especially the World Wide Web), and the like. In general, the data source 610 can be any known or later-developed source that is capable of providing data, such as, for example, input mask data and/or plate data to the input/output interface 410.

The input/output interface 410 may be connected to one or more data sinks 510 over one or more links 520. The data sink(s) 510 can be a locally or remotely located printing system, for example, flexographic printing, gravure printing, offset lithography process, web offset process, sheet lithographic press, web offset press, digital process, static plate, digital plate, flexographic plate, a digital printing press, a digital color printing press, and other printing presses, which can employ spot coatings, or any other a device that stores and/or transmits electronic data, such as a client or a server of a wired or wireless network, such as, for example, an intranet, an extranet, a local area network, a wide area network, a storage area network, the Internet (especially the World Wide Web), and the like. In general, the data sink 510 can be any known or later-developed source that is capable of utilizing spot coating data, such as, for example, mask data and/or plate data provided by the input/output interface 410.

Each of the various links 520 and 620 may be any known or later-developed device or system for connecting the data source(s) 610 and/or the data sink(s) 510, respectively, to the input/output interface 410. In particular, the links 520 and 620 my each be implemented as one or more of, for example, a direct cable connection, a connection over a wide area network, a local area network or a storage area network, a connection over an intranet, a connection over an extranet, a connection over the Internet, a connection over any other distributed processing network or system, and/or an infrared, radio-frequency or other wireless connection.

As shown in FIG. 4, the memory 430 may be physically, functionally, and/or conceptually divided into a number of different memory portions, including a input mask data portion 432 and/or a plate data portion 434. The input mask data portion 432 may store the binary image mask such as, for example, the different coating boundaries and uncoating boundaries within the image. The plate data portion 434 may store a binary pattern to determine portions of a substrate that will be printed.

The memory 430 may be implemented using any appropriate combination of alterable or non-alterable memory, volatile or non-volatile memory, or fixed memory. The alterable memory, whether volatile or non-volatile, can be implemented using any one or more of static or dynamic RAM, a floppy disk and disk drive, a writeable or re-writeable optical disk and disk drive, a hard drive, flash memory or the like. Similarly, the non-alterable or fixed memory can be implemented using any one or more of ROM, PROM, EPROM, EEPROM, an optical ROM disk, such as CD-ROM or DVD-ROM disk, and disk drive or the like.

Alternatively, a mask creating circuit, routine, or application 440 may be provided to create data related to image data, such as, for example, binary image, for example, binary image masks and/or maps, and determine the binary pattern portions that will be receive and/or be overprinted with a clear coating, for example, a spot coating, such as UV coating and/or a varnish coating.

For example, in operation, an input mask data related to an image may be input from the data source to the input/output interface 410. Under control of the controller 420, the data, such as, for example, input mask data and/or plate data, may be stored in the input mask portion 432 and plate portion 434 of the memory 430, respectively. Alternatively, the mask data and/or plate data may be input, under control of the controller 420, directly to the mask modifying circuit, routine, or application 450.

Under control of the controller 420, the mask modifying circuit, routine, or application 450 may access the mask data and/or plate data and may modify one or more edges of the mask data to reduce edge effects. For example, the mask modifying circuit, routine, or application 450 may add one or more gradient sweeps to the image binary masks/maps data. Under control of the controller 420, the mask modifying circuit, routine, or application 450 may access and/or determine the coated and uncoated boundaries either from the mask creating circuit, routine, or application 440, if provided, and/or the input image portion 432 and plate portion 434 of the memory 430.

Under control of the controller 420, the plate creating circuit, routine, or application 460 may be utilized to create a printing plate. For example, under control of the controller 420, the plate creating circuit, routine, or application 460 may access the modified mask data and may create a printing plate. The printing plate, for example, may be used to hold the desired coating areas, and to utilize the printing plate to print the spot coating on the substrate.

Under control of the controller 420, the created plate data may be stored in the plate data portion 434, or may be output to the data sink 510 via the input/output interface 410. Accordingly, the plate data may be utilized to apply a clear coating during a spot coating process. This may be done, for example, by the exemplary method shown in FIG. 1.

While various features have been described in conjunction with the examples outlined above, various alternatives, modifications, variations, and/or improvements of those features and/or examples may be possible. Accordingly, the examples, as set forth above, are intended to be illustrative. Various changes may be made without departing from the broad spirit and scope of the underlying principles.

While the exemplary system has been described as physically, functionally, and/or conceptually divided into a mask creating circuit, routine, or application 440, a gradient sweep adding circuit, routine, or application 450, and/or a plate creating circuit, routine, or application 460 to apply a coating having a gradient sweep at the boundaries between the coated and uncoated areas, it should be appreciated that one or more of the circuits, routines, or applications may be included in and/or executed by the controller 420.

It should be appreciated that various of the above-disclosed and other features and functions, or alternatives thereof, may be desirably combined into many other different systems or applications. Also, various presently unforeseen or unanticipated alternatives, modifications, variations or improvements therein may be subsequently made by those skilled in the art, and are also intended to be encompassed by the following claims.

It should be appreciated that although the above examples refer to digital printing technologies and processes therein, traditional printing processes, may also utilize this technology of applying a gradient sweep in order to reduce the coating thickness between the positions of the coated and uncoated boundaries.

Accordingly, the exemplary techniques described herein, may be utilized with any application utilizing a spot coating. For example, a web offset press or sheet lithographic press that includes a coater in line that utilizes the technology to apply a clear coat, spot coat, UV coatings and/or varnish coatings may employ this technology described herein to gradually produce a gradient sweep to the coating boundaries.

The exemplary methods and systems described herein may also be used with current photographic engraving technology used to produce relief plates. For example, the method for applying gradient sweep in the flexographic printing technology may employ halftone as part of the method and/or process of applying a gradient sweep to coating boundaries. By utilizing the method and/or process of applying a gradient sweep or continuous slope to the coating boundaries of the clear coating, the crisp or sharp edges between the uncoated and coated areas can be modified to a gradient sweep such that, for example, the binary image may be converted to a continuous tone, blurred, and/or halftoned to create a gradient at the boundaries. This method and/or process may be applied at the raster image processor prior to plate imaging, or, for example, upstream, such as with a software plug in.

The exemplary methods and systems as described above may be, for example, used in the application of any printing system that utilizes spot coatings. For example, a device that utilizes, for example, an end-spot UV coater may employ gradient sweep to coating boundaries and/or uncoated boundaries to transform from binary edges to gradient sweeps in order to minimize the harshness of the edge transition between the coated and uncoated boundaries.

The above exemplary methods and systems could be applied, for example, at raster image processor prior to plate imaging, or, for example, upstream as a software plug in. The process may be implemented utilizing, for example, any printing system. The gradient sweep added to the coating boundaries can be implemented using a digital printing press, a digital color printing press utilizing an in-line UV coating device to put down UV coatings on top of or over a substrate, for example, a sheet of paper that includes an image and/or printed piece (such as text). The substrate may include images, text, and/or graphical arts, that are printed for example in newspapers, magazines, comics, dictionaries, newspaper inserts, catalogs, packaging materials, and wrappers.

The exemplary methods and systems as described above may be utilized with any printing system, for example, flexographic printing, gravure printing, offset lithography process, web offset process, sheet lithographic press, web offset press, digital process, static plate, digital plate, flexographic plate, and other printing plates, which can employ spot coatings. Further, the exemplary methods and systems as described above and below may be utilized with digital printing press and digital processing, photographic processing, laser engraving process, and photographic engraving technologies. For example, photographic engraving technologies that utilize spot coatings as part of a process to produce the relief plates.

The exemplary methods and systems described above are beneficial to apply and/or modify the boundary regions in spot coatings to reduce discontinuity. By replacing the sharp edge with, for example, a gradient sweep and/or continuous slope, both perceived spatial variability and unwanted edge effects, can be minimized. Modifying and/or adding spot coatings with a gradient sweep may offer an operator operating a printing system, such as a flexographic printing system that includes, for example, an in-line spot UV coater, with more latitude in the setting of impression cylinder back pressure of the coater to optimize other aspects of coating quality.

The exemplary methods and systems described above may be employed by a device, for example, an in-line spot coater, that is used in coating systems based on flexographic printing technology for direct digital printing systems. The exemplary method and system described above may be implemented by a customer device, such as, for example, a printer, a multifunctional imaging device/system, flexographic coating system, digital printing system, and other printing systems that may use spot coater of the process of creating a printed piece, such as, for example, an image and/or text. The various printing systems that can employ the exemplary methods and systems described above may be utilized in applications such as, for example, digital printing, flexible packaging, tag and label, envelopes, carrier bags, folding cartons, preprint liner, beverage cartons, magazines, newspapers, flexible bags, wrappers, other packaging forms, wallpaper, engraving, and paper and plastic bags.

It will be appreciated that various of the above-disclosed and other features and functions, or alternatives thereof, may be desirably combined into many other different systems or applications. Also, various presently unforeseen or unanticipated alternatives, modifications, variations or improvements therein may be subsequently made by those skilled in the art which are also intended to be encompassed by the following claims.

What is claimed is:

1. A method for reducing edge effects, the method comprising:
    inputting a binary image mask, the binary image mask defining the location of a boundary to receive a coating;
    modifying an edge of the binary image mask to reduce a thickness of the coating at the modified edge;
    creating a printing plate based on the modified image mask; and
    utilizing the printing plate to print the coating on a substrate,
    wherein modifying the edge of the image mask includes applying a gradient sweep at a region of the boundary to receive the coating, and
    applying the gradient sweep to the coating further includes converting the binary image mask to continuous tone, blurring, and then halftoning.

2. The method according to claim 1, wherein the coating is a spot coating.

3. The method according to claim 1, wherein modifying the edge of the binary image mask includes converting the binary image mask to continuous tone, blurring, and then halftoning to reduce the thickness of the coating between a coated boundary and uncoated boundary.

4. The method according to claim 1, further comprising:
utilizing the modified image mask to create a flexographic plate to hold the coating in desired areas, while repelling the coating in undesired areas; and
utilizing the flexographic plate to print the coating on paper.

5. The method according to claim 1, further comprising:
utilizing a digital printing press to create the binary image mask;
creating a graphic design to define a plurality of boundaries of areas to receive spot coating, the plurality of boundaries defining a binary pattern to determine portions of the substrate that will be overprinted with a spot coating and portions of the substrate that will remain untreated;
adding to coating boundaries the gradient sweep to transform the coated and uncoated boundaries from binary edges to gradient sweeps, the binary image being converted to continuous tone, blurred, then halftoned to create the gradient at the boundaries;
creating a flexographic plate utilizing the modified image mask, the flexographic plate being created from the digital printing press, the digital printing press utilizing the modified image mask to determine the boundaries of the flexographic plate for holding the spot coating in the coated areas and to repel the spot coating in the uncoated areas; and
utilizing the flexographic plate to print the spot coating on the substrate.

6. The method according to claim 1, wherein the gradient sweep includes at least one gradient sweep, and the coating is a UV coating.

7. The method according to claim 1, wherein the gradient sweep is a continuous slope, and the coating is a spot coating.

8. A system for reducing edge effects, comprising:
a controller that:
    inputs an image mask, the image mask defining the location of a boundary to receive a coating;
    modifies an edge of the image mask to reduce the thickness of the coating at the modified edge;
    creates a printing plate base on the modified image mask; and
    uses the printing plate to print the coating on a substrate,
wherein the controller applies a gradient sweep at a region of the boundary to receive the coating, and
the controller creates a binary image mask from inputted image mask data, and converts a binary image mask to continuous tone, blurs and then halftones to create the gradient sweep at the coated and uncoated boundaries.

9. The system according to claim 8, wherein the gradient sweep includes at least one gradient sweep, and the coating is a spot coating.

10. The system according to claim 8, wherein the gradient sweep is a continuous slope.

11. The system according to claim 8, wherein the controller uses the modified image mask to create a flexographic plate to hold the coating in desired areas, while repelling the coating in undesired areas; and
uses the flexographic plate to print the coating on paper.

12. The system according to claim 8, wherein the controller uses a digital printing press to create the modified image mask;
creates a graphic design to define a plurality of boundaries of areas to receive spot coating, the plurality of boundaries defining a binary pattern to determine portions of the substrate that will be overprinted with the spot coating and portions of the substrate that will remain untreated;
adds to coating boundaries the gradient sweep to transform the coated and uncoated boundaries from binary edges to gradient sweep, the binary image being converted to continuous tone, blurred, then halftone to create the gradient at the boundaries;
creates a flexographic plate using the modified image mask, the flexographic plate being created from the digital printing press, the digital printing press uses the modified image mask to determine the boundaries of the flexographic plate for holding the spot coating in the coated areas and to repel the spot coating in the uncoated areas; and
uses the flexographic plate to print the spot coating on the substrate.

13. A computer-readable storage medium storing a set of program instructions executable on a data processing device and usable for reducing edge effects, the instructions comprising:
instructions for inputting a binary image mask, the binary image mask defining the location of a boundary to receive a coating;
instructions for modifying an edge of the binary image mask to reduce the thickness of the coating at the modified edge;
instructions for creating a printing plate base on the modified image mask; and
instructions for using the printing plate to print the coating on a substrate,
wherein the instructions for modifying the edge include instructions for converting the binary image mask to continuous tone, bluffing, and then halftoning to create a gradient sweep at a coated and uncoated boundaries.

14. The program according to claim 13, wherein the gradient sweep is a continuous slope.

15. The program according to claim 13, further comprising instructions for:
utilizing a digital printing press to create the modified image mask;
creating a graphic design to define a plurality of boundaries of areas to receive spot coating, the plurality of boundaries defining a binary pattern to determine portions of the substrate that will be overprinted with a spot coating and portions of the substrate that will remain untreated;
adding to coating boundaries the gradient sweep to transform the coated and uncoated boundaries from binary edges to gradient sweeps, the binary image being converted to continuous tone, blurred, then halftone to create the gradient at the boundaries;
creating a flexographic plate utilizing the modified mask, the flexographic plate being created from the digital printing press, the digital printing press utilizing the modified mask to determine the boundaries of the flexographic plate for holding the spot coating in the coated areas and to repel the spot coating in the uncoated areas; and
utilizing the flexographic plate to print the spot coating on the substrate.

* * * * *